(12) United States Patent
Taraud et al.

(10) Patent No.: US 9,466,695 B2
(45) Date of Patent: Oct. 11, 2016

(54) VALVE FOR FLUID CIRCULATION

(71) Applicants: COMMISSARIAT A L'ENERGIE ATOMIQUE ET AUX ENERGIES ALTERNATIVES, Paris (FR); REG Technology, Haubourdin (FR)

(72) Inventors: Pascal Taraud, Pertuis (FR); Arnaud Delabergerie, Bethune (FR); Olivier Gastaldi, Jouques (FR); Patrice Pennel, Croix (FR)

(73) Assignees: Commissariat A L'Energie Atomique Et Aux Energies Alternatives, Paris (FR); REG Technology, Haubourdin (FR)

( * ) Notice: Subject to any disclaimer, the term of this patent is extended or adjusted under 35 U.S.C. 154(b) by 0 days.

(21) Appl. No.: 14/575,376

(22) Filed: Dec. 18, 2014

(65) Prior Publication Data
US 2015/0171190 A1 Jun. 18, 2015

(30) Foreign Application Priority Data

Dec. 18, 2013 (FR) ...................................... 13 62929

(51) Int. Cl.
*F16K 31/04* (2006.01)
*H01L 29/66* (2006.01)
(Continued)

(52) U.S. Cl.
CPC ........... *H01L 29/66621* (2013.01); *F16K 1/12* (2013.01); *F16K 31/04* (2013.01); *F16K 31/0662* (2013.01); *G21C 15/00* (2013.01);
(Continued)

(58) Field of Classification Search
CPC .. F16K 1/12; F16K 31/0606; F16K 31/0651; F16K 31/0658; F16K 31/0662; F16K 31/0665

USPC ........... 251/65, 129.11, 129.12, 129.21, 215, 251/216, 218, 220, 248, 264, 266, 273, 274, 251/344, 347; 74/424.71, 424.81; 166/66.7
See application file for complete search history.

(56) References Cited

U.S. PATENT DOCUMENTS

| 2,289,574 | A | * | 7/1942  | Carlson .......................... 251/65 |
| 4,057,217 | A | * | 11/1977 | MacDonald .................. 251/308 |
| 4,452,423 | A | * | 6/1984  | Beblavi et al. ................. 251/65 |
| 4,579,177 | A | * | 4/1986  | Going, III .................... 166/66.5 |

(Continued)

FOREIGN PATENT DOCUMENTS

| CA | 2550524 | 12/2006 |
| EP | 0257906 | 3/1988 |
| EP | 0434912 | 7/1991 |

(Continued)

OTHER PUBLICATIONS

Written Opinion issued on FR1362929 (pp. 5).

*Primary Examiner* — Matthew W Jellett
(74) *Attorney, Agent, or Firm* — The Farrell Law Firm, P.C.

(57) ABSTRACT

A valve is provided with a casing forming an enclosure for fluid flow with a fluid inlet and outlet, a shutter cooperating with a seat integral with the casing that closes the inlet or outlet, and a device controlling the shutter position relative to the seat. The control device includes an inductor and armature magnetically coupled for the inductor to drive the armature in rotation to selectively cause the shutter to move closer to or to move away from the seat, with the inductor being stationary relative to the casing. The armature is positioned inside the enclosure and is stationary relative to a screw carrying the shutter, with the screw cooperating with a nut integral with the casing to transform a rotation of the armature into a translation of the shutter.

27 Claims, 3 Drawing Sheets

(51) Int. Cl.
    *H01L 21/306*     (2006.01)
    *H01L 29/10*     (2006.01)
    *H01L 29/423*     (2006.01)
    *H01L 29/78*     (2006.01)
    *F16K 1/12*     (2006.01)
    *F16K 31/06*     (2006.01)
    *G21C 15/00*     (2006.01)
    *G21D 1/00*     (2006.01)
    *G21C 1/02*     (2006.01)

(52) U.S. Cl.
    CPC ........... *G21D 1/00* (2013.01); *H01L 21/30604* (2013.01); *H01L 29/1054* (2013.01); *H01L 29/4236* (2013.01); *H01L 29/7849* (2013.01); *G21C 1/02* (2013.01); *Y02E 30/35* (2013.01)

(56) References Cited

U.S. PATENT DOCUMENTS

| | | | |
|---|---|---|---|
| 4,789,132 A | 12/1988 | Fujita et al. | |
| 4,948,091 A | 8/1990 | Satoh et al. | |
| 4,984,601 A * | 1/1991 | Andersson et al. | 137/486 |
| 6,802,488 B1 | 10/2004 | Patterson | |
| 6,840,200 B2 * | 1/2005 | Miller | 123/90.11 |
| 8,746,658 B2 * | 6/2014 | Gauss et al. | 251/344 |
| 2003/0178593 A1* | 9/2003 | Grytz | 251/129.16 |
| 2010/0025608 A1 | 2/2010 | Esveldt | |

FOREIGN PATENT DOCUMENTS

| | | |
|---|---|---|
| EP | 1985900 | 10/2008 |
| WO | WO 8400592 | 2/1984 |
| WO | WO 2006112236 | 10/2006 |

* cited by examiner

VALVE FOR FLUID CIRCULATION

PRIORITY

This application claims priority under 35 U.S.C. §119(a) to a French Patent Application filed Dec. 18, 2013, and assigned Ser. No. FR. 13/62929, the entire disclosure of which is incorporated herein by reference.

BACKGROUND OF THE INVENTION

1. Field of the Invention

The present invention concerns nuclear power, the operation of sodium-cooled fast-neutron reactors and, more precisely, relates to the field of valves. The present invention advantageously relates to valves for the circulation of liquid metal, such as liquid sodium, heated to a high temperature which may, for instance, reach 450° C.

2. Description of the Related Art

Fourth generation cooled reactors such as the ASTRID (Advanced Sodium Technological Reactor for Industrial Demonstration) reactor use a liquid metal, generally sodium as a coolant. Such coolant, in addition to having a very high temperature, typically above 400° C., is generally chemically very reactive.

It is thus essential to provide as reliable tightness as possible all along the travel of the fluid and more particularly at the valves.

To control the sodium flow, several valve types have been developed. Such sodium valves use a shutter so configured as to cooperate with a seat so as to prevent the liquid sodium from flowing. A control device has a motorized or manual wheel, connected by a mobile rod to the shutter and the actuation of which makes it possible to selectively move the shutter closer to, or away from the seat.

To provide tightness, a first type of sodium valve uses a solidified sodium gasket. In such type of sodium valve, a portion of the valve in contact with the mobile rod is so configured as to receive the liquid sodium and lower the temperature thereof. In this portion, the sodium solidifies and provides tightness to the outside. Other tight members such as gaskets are also used.

The specific drawback of such valve type is that it requires a complex system for holding the actuating device and the tightness system. As a matter of fact, the actuating device and the tightness system form an important mass. Besides, such important mass is relatively offset relative to the duct which increases the risks of breakage, more particularly in case of an earthquake. To reduce the risks of breakage, complexes and expensive holding systems are thus used, today.

A second type of sodium valve provides tightness by bellows. In such sodium valve type, the rod is equipped with bellows forming a barrier for the passage of the liquid sodium.

Such valve makes it possible to somehow reduce the offset between the duct and the actuation and tightness device although such offset is not totally eliminated. On the other hand, such valve type implies many mechanical parts, which will wear and reliability is thus limited.

A need therefore exists, which consists in providing a valve making it possible to reduce or even eliminate at least one of the drawbacks entailed in the known valves for liquid sodium.

The present invention aims at meeting such need. More precisely, the present invention aims at reducing the complexity of the systems holding the control and tightness devices of the existing sodium valves and/or improving the reliability of the tightness thereof.

SUMMARY OF THE INVENTION

To reach this objective, one aspect of the present invention relates to a valve that includes a casing forming an enclosure inside which a fluid is intended to flow and having at least one inlet and at least one outlet for the fluid, a shutter configured to cooperate with a seat integral with the casing to close at least the inlet or at least the outlet of the fluid, and a device for controlling the position of the shutter relative to the seat.

Preferably, the control device comprises at least one inductor and at least one armature magnetically coupled and so configured that the inductor drives the armature in motion, preferably in rotation, so as to selectively cause the shutter to move closer to or to move away from the seat.

Preferably, the armature is positioned inside the enclosure and is integral with a screw carrying the shutter, with the screw being so configured as to cooperate with a nut integral with the casing so as to transform a rotation of the armature into a translation of the shutter.

Preferably, the screw is hollow and the valve is so configured that the fluid at least partially flows through the screw.

The shutter is thus offset thanks to the armature which is positioned inside the enclosure. The control stress is thus transmitted without a mechanical connection between an external actuator and the shutter. This makes it possible to significantly reduce the tightness constraints as compared to the existing valves for sodium the tightness of which is provided by a solidified sodium gasket or bellows. Besides, such valve structure comprises a reduced number of parts. One member only translates relative to the casing. This element more particularly comprises the armature, the screw made integral with the armature and the shutter carried by the screw.

The strength and the reliability of the valve tightness are thus significantly improved as compared to the existing valves for sodium.

The valve according to the invention further provides other advantages.

More particularly, the device controlling the position of the shutter is positioned very close to the enclosure as regards the inductor and even inside the enclosure as regards the armature. The invention thus makes it possible to reduce the offset of the control device. It should be reminded that the existing valves for sodium the tightness of which is provided by a solidified sodium gasket or bellows require a stress transmission rod between the shutter and a manual or motorized wheel. Besides, in spite of the usually complex holding systems implemented, the mass offset inevitably increases the risks of breakage in case of an earthquake. The invention thus provides a significant advantage for the applications wherein safety is a fundamental challenge as is nuclear power.

Besides, by providing a nut carried by the casing and a hollow screw through which the fluid flows, the valve according to the invention makes it possible to significantly reduce head losses.

It further enables high flows for limited overall dimensions as compared to the existing valves for a liquid metal. Typically, for an application with liquid sodium, the valve according to the invention enables a speed of the fluid which may exceed 10 meters per second. It is thus perfectly appropriate for sodium-cooled fast-neutron reactors.

Besides, by providing an armature integral with the screw, the invention makes it possible to prevent any risk of seizing between the armature and the screw relative to a solution wherein the armature and the screw would not have been made integral with each other.

The cost of the invention is further significantly reduced as compared to the existing sodium valves.

Optionally, the invention may further have at least any one of the following characteristics which may be taken into account separately or in combination:

Preferably, the inductor is stationary relative to the casing. Preferably, the inductor is integral with the casing. Such embodiment will be preferred when the inductor comprises at least one coil. Alternatively, the inductor is driven in rotation when it comprises permanent magnets only.

Advantageously, the valve is so configured that the screw is immersed in the fluid.

Preferably, the valve is so configured that the fluid mainly flows through the screw. Preferably, it is so configured that the whole fluid flows inside the screw.

Preferably, the casing has a wall forming the enclosure. Advantageously, the inductor and the armature are positioned on either side of the wall forming the enclosure.

Preferably, the nut is carried by an inner face of the wall.

Preferably, the casing has a cylindrical wall.

Advantageously, the thread of the nut is carried by the cylindrical wall.

Advantageously, the inductor is positioned outside the enclosure. This makes it possible to eliminate any tightness constraint of the liquid relative to the inductor. Preferably, the inductor is positioned on an outer face of the wall of the casing.

Advantageously, the valve is so configured that the whole fluid flows through the screw. Preferably, the screw has an inner wall which partially forms at least a flow space so that all the fluid flows through the screw. Preferably, the screw has an inner wall which totally defines the flow space on at least a longitudinal portion of the enclosure.

Advantageously, the enclosure is tight. The fluid cannot escape from the enclosure except for the inlet and the outlet. It is not in contact with the atmosphere.

Preferably, the screw has an outer face which is positioned opposite the inner face of the wall of the casing and which carries a thread so configured as to cooperate with the nut.

Advantageously, the wall of the casing has an inner face a portion of which at least is cylindrical and the screw has an inner wall a portion of which at least is cylindrical and wherein the ratio of the diameter of the inner wall of the screw to the diameter of the inner face of the wall of the casing at the cooperation between the screw and the nut, and more precisely at the thread of the screw, is above 0.6 and preferably above 0.7 and preferably above 0.85. Typically, it ranges from 0.7 to 0.9. This makes it possible to authorize a high flow for limited overall dimensions.

Advantageously, the cooperation between the screw and the nut forms a connection of the ball screw type. This makes it possible to limit the seizing and the wear of the parts, which thus improves the strength and the reliability of the valve.

According to a particularly advantageous embodiment, the ball screw is so configured as to be irreversible, so that a pushing force applied onto the shutter, at least in the direction tending to move the shutter away from the seat, does not enable to drive the screw in rotation in this direction. Thus, even though the pressure of the fluid is high and even though no torque is applied by the inductor on the armature, the screw cannot be driven in rotation and thus does not move the shutter away from its seat. Only a rotation applied to the screw enables this. Such characteristic makes it possible to improve the safety and reliability of the valve even more since, even in case of failure of the control device, the valve will remain closed. Such improvement of safety is particularly advantageous when the valve is integrated in a nuclear reactor circuit.

Advantageously, the casing forms a monolithic part. It is not formed of parts made integral with each other by screws and flanges. This makes it possible to significantly improve the strength and the reliability of the valve, which is a significant advantage since fluid leakages might cause serious damages, as is the case with liquid sodium.

Preferably, the casing is made of metal.

Preferably, it is formed of parts welded together only.

Preferably, the screw is made of metal.

Preferably, the shutter is articulated in free rotation on the screw at least around the axis of translation of the screw. This makes it possible to reduce, or even to eliminate the friction between the shutter and the seat when closing the valve. Wear of the shutter and of the seat is thus significantly limited.

Preferably, the mechanical connection between on the one hand the casing and on the other hand the screw is provided by the cooperation between the screw and the nut only. Thus, no bearing is provided between the moving element and the casing, other than the balls, if any, of a ball screw system forming the cooperation between the screw and the nut. The invention thus eliminates all the tightness constraints that might be imparted between the bearings and the fluid.

Advantageously, the valve comprises an envelope integral with the screw and cooperating with the screw to form a tight housing intended to receive the armature. The armature is thus positioned in a tight housing. As the envelope and the screw are made integral with one another, the tightness between these two parts is static, which still simplifies the valve and increases the reliability thereof. In such preferred embodiment, the valve requires no gasket inside the enclosure. The only tightness is the one inevitably required between the valve and the ducts intended to be connected to the valve inlet and outlet. Thus, the valve tightness is thus provided by the enclosure only.

According to an alternate embodiment, the armature is placed opposite the inner wall of the casing, and joints in contact with the inner wall of the casing and the screw or the armature are positioned on either side of the armature according to the direction of translation of the screw and are so configured as to prevent the fluid from reaching the armature.

In another embodiment, a protective layer integral with the armature covers the latter. It is positioned between the armature and the inner face of the casing.

Preferably, the casing mainly extends in a longitudinal direction corresponding to the direction of translation of the screw and at least one of the inlet and the outlet is so conformed as to form a low point of the enclosure at least for a position of the valve wherein the longitudinal direction thereof is positioned horizontally. Thus, even in horizontal position, the valve has no fluid retention point. This is particularly advantageous to drain the valve or to prevent the fluid from undergoing transformations prejudicial to the correct operation of the device. The invention thus makes it possible to prevent the liquid sodium in retention from transforming into soda after solidification.

Preferably, the casing mainly extends in a longitudinal direction corresponding to the direction of translation of the screw and has at least one of the inlet and the outlet which is offset relative to the direction of translation of the screw.

The screw is thus driven by the magnetic force of the control device only.

The control device forms an electric motor the rotor of which is integral with the screw.

According to one embodiment, the control device comprises permanent magnets. This makes it possible to reduce the overall dimensions of the valve. In a combination or an alternative solution, the control device comprises coils. This makes it possible to reduce the cost of the valve 1.

Another aspect of the present invention relates to a system controlling the circulation of a liquid metal comprising a metal duct and a valve according to the invention, with the casing and the screw being made of metal and the valve being welded to such duct.

Another aspect of the present invention relates to the use of the valve according to the invention for controlling a fluid having a temperature greater than or equal to 350° C. and preferably greater than or equal to 400° C. Preferably, the fluid is a liquid metal. Preferably, the liquid is liquid sodium.

Other objects, characteristics and advantages of the present invention will become apparent upon examining the following description and the appended drawings. It is understood that other advantages may be included.

BRIEF DESCRIPTION OF THE FIGURES

The goals and objectives as well as the characteristics and advantages of the invention will better emerge from the detailed description of an embodiment of the latter which is illustrated by the following appended drawings wherein.

The drawings appended herein are given as examples and are not limiting to the invention. These are schematic drawings intended to facilitate the understanding of the invention and are not necessarily at the same scale of the practical applications. More particularly, the relative thickness and dimensions of the various parts, walls and members are not a representation of reality.

DETAILED DESCRIPTION OF THE INVENTION

An example of an implementation method according to the invention will be detailed. Devices for implementing the method will then be described.

Figure 1:
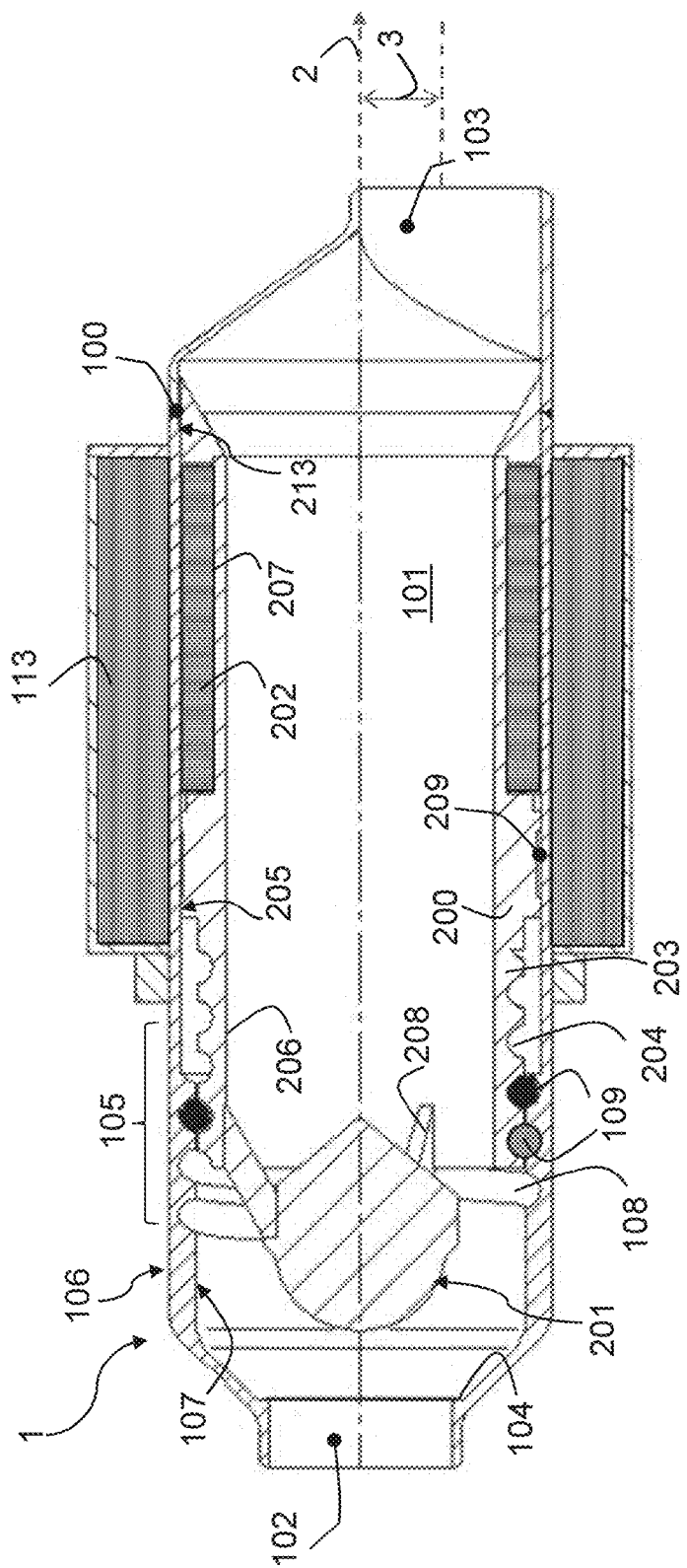
FIG. 1 is a longitudinal sectional view of a valve according to a not restrictive example of the invention, with the valve in open position.
Figure 2:
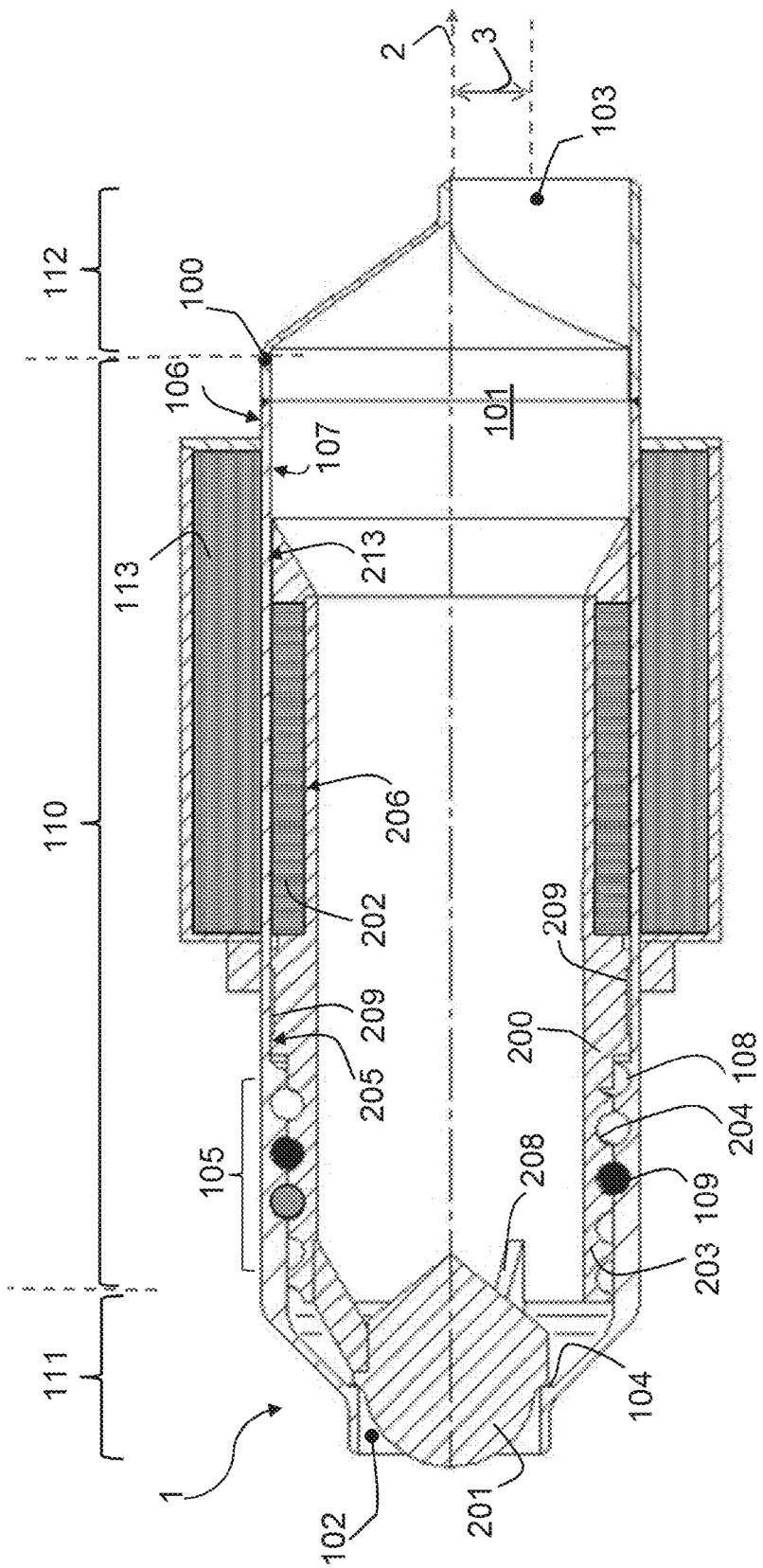
FIG. 2 is a longitudinal sectional view of the valve illustrated in FIG. 1, with the valve being in closed position.

Referring to FIGS. 1 and 2, a not restrictive example of the valve 1 according to the invention will now be described.

The valve 1 comprises a casing 100 forming an outer jacket and which defines an enclosure 101 inside which the fluid is intended to flow. In this not restrictive example, the casing 100 has an inlet 102 and an outlet 103. Except for the inlet 102 and the outlet 103, the enclosure 101 is tight. The casing 100, at the inlet 102 and the outlet 103, forms ends to be welded so as to cooperate with a duct element to provide a fluid connection of the valve 1 to a fluid network or to flanges. Within the scope of an application to sodium-cooled nuclear reactors, the ends are preferably welded on ducts of the sodium circuit.

The valve 1 also comprises a moving element 200 inside the casing 100. Advantageously, such moving element 200 is entirely accommodated inside the enclosure 101. It can move in translation inside the casing 100. Preferably, the enclosure 101 mainly extends in a longitudinal direction 2, corresponding to the axis of translation bearing reference 2 of the moving element 200. The moving element 200 has a shutter 201 intended to cooperate with a complementary zone forming the seat 104 and integral with the casing 100. Preferably, the seat 104 is formed by the wall of the casing 100 which defines the enclosure 101. When the shutter 201 is applied against the seat 104, it closes the passage of the fluid and when it is away from the seat 104, it authorises the flowing of the fluid. The position of the shutter 201 relative to the seat 104 thus makes it possible to control the flow of the fluid.

In the not restrictive example illustrated, the seat 104 is positioned close to the inlet 102. A displacement of the moving element 200 in the direction of the arrow illustrated in FIGS. 1 and 2 (i.e. a displacement from the inlet 102 to the outlet 103) causes the shutter 201 to move away from the seat 104 to reach the open configuration illustrated in FIG. 1. On the contrary, a displacement of the shutter 201 in the direction opposite that of the arrow (i.e. a displacement from the outlet 103 to the inlet 102) causes the shutter 201 to move closer to the seat 104 to reach the closed configuration illustrated in FIG. 2.

The moving element 200 comprises, or is formed by a screw 203. Such screw 203 is so configured as to cooperate with a complementary surface integral with the casing 100. Preferably, the screw 203 has an outer face 205 provided with a thread 204 so formed as to cooperate with a complementary thread 108 carried by an inner face 107 of a wall of the casing 100. According to a particular embodiment, the threads 108 and 204 are in direct contact with the fluid.

The moving element 200 thus forms a screw/nut connection with the casing 100. The axis of translation and of rotation of such connection is the axis 2 illustrated in FIGS. 2 and 3. Preferably, such screw/nut connection is of the ball screw type 109 which makes it possible to reduce the risks of seizing. The rotation in a first direction of the screw 203 thus moves the shutter 201 away from the seat 104 and the rotation of the screw 203 in a second direction moves the shutter 201 closer to the seat 104.

Particularly advantageously, the screw 203 is controlled by a magnetic control device. An inductor 113 magnetically drives an armature 202 integral with the moving element 200. According to a first preferred embodiment illustrated in the Figures, the armature 202 and the moving element 200 form distinct parts fixed on one another. According to an alternate embodiment, the armature 202 is formed by the screw 203. Thus, in this embodiment, the material(s) composing the latter is/are so selected that the screw 203 can be used as an armature. The screw and the armature thus form a monolithic part.

In operation, the armature 202 is located and moves inside the enclosure 101. Advantageously, the inductor 113 is positioned outside the casing 100, thus reducing the tightness constraints.

More precisely, the inductor 113 and the armature 202 are positioned on either side of the wall forming the enclosure 101 inside which the fluid flows. According to one embodiment, the control device thus forms an electric motor.

Typically, at the inductor 113 at least, the outer face 106 of the wall is cylindrical and the inductor 113 surrounds this wall. Preferably, the inner face 107 of the wall is also cylindrical and surrounds the armature 202 with a very small running clearance so as to enable the rotation of the armature 202 inside the wall forming the enclosure 101. The control device driving the displacement of the shutter 201 is thus particularly compact. It requires no complex holding system. Besides, it significantly reduces the moving away of the mass carried over or even has no mass away from the ducts. The invention thus makes it possible to significantly simplify the valve 1 and improve the reliability as well as the security thereof in case of important shock or of an earthquake.

In an advantageous embodiment not shown, the armature 202 is carried by the moving element 200 by being covered with an envelope which separates the armature 202 from the fluid. The moving element 200 preferably comprises a housing 207 so configured as to accommodate the armature 202 and the envelope makes it possible to define a closed and tight volume inside the housing 207. Such tightness is static, since, in operation, the envelope is integral with the moving element 200. The tightness of the armature 202 is thus provided in a particularly simple and efficient way.

In another embodiment, the armature 202 is encapsulated in a protective layer. It is covered with a protective layer which isolates it from the fluid. Preferably, such protective layer is a film of steel, usually called a liner.

In another embodiment, like the one illustrated in FIGS. 1 and 2, the armature 202 is positioned directly opposite the inner face 107 of the wall of the casing 100. To protect the armature, it may be encapsulated in a protective layer like in the preceding embodiment. Alternatively, joints may be placed between the moving element 200 and the inner face 107 of the wall of the casing 100 by being distributed on either side of the armature 202 according to the axis of translation of the screw 203. Preferably, the joints are accommodated in the cavities 209.

The moving element 200 preferably has an inner passage for the flowing of the fluid. Therefore, the screw 203 is hollow. The whole fluid preferably flows through such passage. According to a particularly advantageous embodiment, the moving element 200 has a substantially cylindrical shape on at least a longitudinal portion thereof. Such portion comprises the outer thread 204 of the screw 203 and the armature 202. Such portion is hollow and has an inner face 206 which defines the flow space on a longitudinal portion of the valve 1.

It should be noted that, even though a part of the fluid flew between the inner face 107 of the wall of the casing 100 and the outer face 213 of the moving element 200, this would not result in the fluid leaking out of the casing 100.

According to a preferred embodiment, the moving element 200 forms a single part with the screw 203.

According to a preferred embodiment, the inner wall of the screw 203 at the thread thereof 204 to cooperate with the nut 105 defines a section for the passage of the fluid. Preferably, the whole fluid flows through this section. Advantageously, the ratio of the diameter of the inner wall of the screw 203 to the diameter of the inner face 107 of the wall of the casing 100 at the point of cooperation between the screw 203 and the nut 105, and more precisely at the thread 204 of the screw 203, is greater than 0.6 and preferably greater than 0.7 and preferably greater than 0.85. Typically, it ranges from 0.7 to 0.9. This makes it possible to authorize a high flow for limited overall dimensions. This makes it possible to advantageously limit head losses.

Typically, within the scope of a sodium circuit for a nuclear reactor, at the thread 108 carried by the nut 105, the diameter of the inner face 107 of the wall of the casing 100 may be greater than several tens of centimeters and that of the inner wall may also be greater than several tens of centimeters. The speed of sodium may reach a maximum of 10 m/s.

Preferably, the guiding in rotation of the moving element 200 in the casing 100 is provided by the screw 203/nut 105 couple only. Thus, the valve 1 requires no ball bearing inside the casing 100. This is particularly advantageous for the nuclear applications since the presence de liquid sodium with the ball bearings might make the valve 1 significantly more complex.

The guiding in translation of the moving element 200 in the casing 100 is preferably provided by the cooperation between the nut 105 and the screw 203 only. Adequately adjusted journals may also be provided to improve the guiding in translation.

Particularly advantageously, the ball screw connection is so dimensioned as to be irreversible. The invention thus makes it possible to provide a passive holding of the shutter 201 against the seat 104, thus significantly improving the safety of the valve 1 even in case of failure of the control device. For example, for an intermediate diameter of the inner thread 204 and of the outer thread 108 of 98 mm and for a thread pitch of 15 mm, a lead angle of 2.8 will be chosen.

The outlet 103 and/or the inlet 102 preferably prevent any fluid retention in the enclosure 101. For example, as illustrated in FIGS. 1 and 2, the outlet 103 is offset relative to the axis of translation. The offset bears reference 3 in the Figures. The outlet 103 preferably constitutes a low point for the valve 1 when the longitudinal direction 2 thereof is positioned horizontally. This is particularly advantageous to drain the valve 1. The advantage is still more obvious when the fluid is sodium and solidification in retention pockets would create soda.

As illustrated in FIG. 2, the inner face 107 of the wall of the casing 100 has a cylindrical central portion 110, preferably having a constant diameter, as well as two end portions 111, 112. A first end portion 111 is tapered and connects the central portion 110 with the flange centered on the axis of rotation of the screw 203. Another end portion 112 is partially tapered and connects the central portion 110 with the flange which is offset relative to the axis of rotation of the screw 203.

According to another embodiment, combined with or as an alternative to the preceding one, the inlet 102 is offset and constitutes a low point avoiding retention pockets.

According to another embodiment, the inlet 102 and the outlet 103 are coaxial with respect to one another and coaxially positioned to the axis of translation.

The screw 203 preferably forms a monolithic part comprising at least the inner thread 204 and the armature 202 reception area. According to an advantageous embodiment, the screw 203 is integral with a support 208 of the shutter 201 which is for example welded on the screw 203 or which forms a monolithic part with the latter.

The support 208 of the shutter 201 comprises ridges connecting the screw 203 to the shutter 201 and openings for the passage of the fluid. The seat 104 and the shutter 201 are centered on the axis of rotation of the screw 203. The shutter 201 preferably has a spherical portion intended to rest against the seat 104 which has a circular or tapered portion so that the closing of the valve 1 is provided by a circular contact.

According to a particularly advantageous embodiment, the shutter 201 is mounted so as to rotate freely relative to the screw 203 at least around the axis of rotation of the screw 203. This makes it possible to eliminate the friction between the shutter 201 and the seat 104 by transferring the rotation movement between the shutter 201 and the screw 203 thus limiting the wear of the seat 104 and of the shutter 201. Preferably, the support 208 of the shutter 201 is integral with the screw 203 and receives the shutter 201 through a simple rotating joint around the axis of rotation of the screw 203.

The moving element 200 composed of the screw 203 and of the support 208 of the shutter 201 is preferably entirely made of metal. It may be monolithic or formed by welded parts. Preferably, the shutter 201 is also made of metal.

In a particular embodiment, the shutter 201 is stationary relative to the screw 203 and forms with the latter and the support 208 of the shutter 201 a monolithic part.

The wall of the casing 100 defining the enclosure 101 preferably forms only one piece. It is preferably made of metal. It is preferably obtained by welding several parts. Preferably, the assembly of the casing 100 possibly except for the inductor 113 and of the device supplying power to the latter, when the inductor 113 is not a permanent magnet, is totally made of metal.

The valve 1 may thus be entirely made of metal. Thus it is perfectly adapted to aggressive chemical liquids and/or to liquids heated at a very high temperature such as for example the sodium coolant used in the 4th generation nuclear reactors. According to a preferred embodiment, the valve 1 according to the invention comprises no gasket 300. The casing 100, respectively the screw 203 are preferably totally welded, which still increases the strength and the reliability of the assembly.

According to a particularly advantageous embodiment, the driving in rotation of the screw 203 by the control device is ensured by permanent magnets. This makes it possible to reduce the overall dimensions of the valve 1.

According to an alternate embodiment, the control device comprises a motor provided with coils. The advantage of this alternative is that it is less expensive than permanent magnets.

Figure 3:
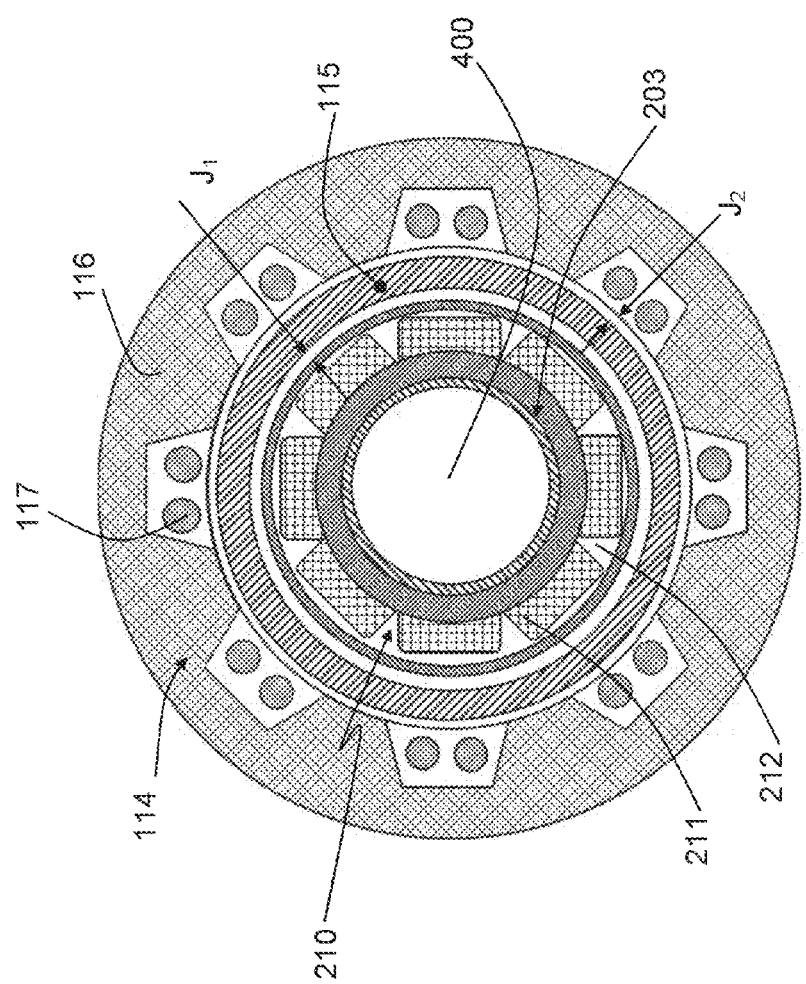
FIG. 3 is a radial sectional view of a valve according to another not restrictive example of the invention, with the section being along the inductor and the armature.

FIG. 3 illustrates another embodiment comprising magnets and coils. In this embodiment the fluid is surrounded by the screw 203. The armature 202 forming the rotor 210 surrounds the screw 203. It comprises magnets 211 and a magnetic cylinder head 212. The wall of the casing 100 forms a duct 115 surrounding the rotor 210 by remaining distant therefrom by a clearance J1. The inductor 113 forms the stator 114 and surrounds the duct 115. The stator comprises coils 116 and a magnetic cylinder head 117. A clearance, bearing reference J2, preferably separates the stator 114 and the duct 115.

Particularly advantageously, a device for manually activating the inductor 113 and/or an additional manually actuatable inductor may be provided for enabling the manual moving of the screw 203. This makes it possible to control the position of the shutter 201 even in case of failure of the inductor 113.

The valve 1 according to the invention is thus particularly advantageous in the field of nuclear reactors, and more precisely in the sodium circuit of a sodium-cooled fast-neutron reactor.

In view of the above description, the valve 1 according to the invention clearly provides enhanced strength and a significantly improved tightness as compared to the existing valves 1. Besides, it makes it possible to limit head losses and to provide a high flow while maintaining reduced overall dimensions. Its design enables a full-metal manufacturing, which still increases its robustness and its reliability. It additionally provides an easier draining and reduces the risks of unintended retention of fluid. Its cost is relatively low.

Although particularly advantageous for controlling liquid sodium, the valve according to the invention is not limited to the regulation of liquid metal or to the regulation of liquid at temperatures above 300° C.

While the invention has been shown and described with reference to a certain embodiments thereof, it will be understood by those skilled in the art that various changes in form and detail may be made therein without departing from the spirit and scope of the invention as defined by the appended claims and their equivalents.

REFERENCES

1. Valve
2. Longitudinal direction
3. Offset
100. Casing
101. Tight enclosure
102. Inlet
103. Outlet
104. Seat
105. Nut
106. Outer face
107. Inner face
108. Outer thread
109. Ball
110. Cylindrical portion
111. Tapered wall
112. Partially tapered wall
113. Inductor
114. Stator
115. Ducts
116. Coils
117. Cylinder head

What is claimed:

1. A valve comprising:
a casing forming an enclosure inside which a fluid is intended to flow and having at least one inlet and at least one outlet of the fluid;
a shutter configured as to cooperate with a seat integral with the casing to close the at least at least one inlet or the at least outlet of the fluid; and
a device for controlling the position of the shutter relative to the seat,
wherein the control device comprises at least an inductor and at least one armature magnetically coupled and configured that the inductor drives the at least one armature in rotation so as to selectively cause the shutter to move closer to or to move away from the seat,
wherein the at least one armature is positioned inside the enclosure and is stationary relative to a screw carrying the shutter and having a thread, with the thread of the screw configured to cooperate with a nut integral with the casing, so as to transform a rotation of the at least one armature into a translation of the shutter, and
wherein the screw is hollow to define an inner passage for the fluid, and the screw has a wall, the wall having an inner face defining the inner passage and an outer face opposite to the inner face, said outer face being provided with said thread, and the valve is configured for the fluid to primarily flow from the at least one inlet to a first opening in the screw through the inner passage to a second opening of the screw to the at least one outlet.

2. The valve according to claim 1, wherein the inner passage for the fluid is defined by the inner face of the wall of the screw,
wherein the inner passage for the fluid and the thread provided on the outer face are situated in a same cross section of the valve, and
wherein the cross section is perpendicular to an axis of the translation of the shutter.

3. The valve according to claim 1, wherein the valve is configured so that the fluid flows entirely through the screw.

4. The valve according to claim 1, wherein the casing includes a wall forming the enclosure,
wherein the inductor and the at least one armature are positioned on either side of the wall, and
wherein the nut mounts on an inner face of the wall.

5. The valve according to claim 4, wherein the wall of the casing has an inner face, at least a portion of which is cylindrical and the screw has an inner wall, at least a portion of which is cylindrical, and
wherein a ratio of a diameter of the inner wall of the screw to a diameter of the inner face of the wall of the casing is greater than 0.6.

6. The valve according to claim 1, wherein the screw and the nut form a ball screw type connection.

7. The valve according to claim 6, wherein the ball screw type connection is configured to be irreversible, so that a pushing force applied to the shutter, at least in the direction tending to move the shutter away from the seat, does not rotate the screw.

8. The valve according to claim 1, wherein the casing forms a monolithic part.

9. The valve according to claim 1, wherein the casing is formed of parts welded together only.

10. The valve according to claim 1, wherein the casing and the screw are made of metal.

11. The valve according to claim 1, wherein the shutter is articulated in free rotation on the screw at least around an axis of translation of the shutter.

12. The valve according to claim 1, wherein a mechanical connection is formed between the casing and the screw by cooperation between the screw and the nut only.

13. The valve according to claim 1, further comprising an envelope integral with the screw and cooperating with the screw to form a tight housing to receive the at least one armature.

14. The valve according to claim 1, wherein the at least one armature and the screw form a monolithic part.

15. The valve according to claim 1, wherein the enclosure extends in a substantially longitudinal direction corresponding to a direction of translation of the screw and at least one of the inlet and the outlet to form a low point of the enclosure at least for a position of the valve.

16. The valve according to claim 15, wherein the longitudinal direction thereof is horizontally positioned.

17. The valve according to claim 1, wherein the casing extends in a substantially longitudinal direction corresponding to a direction of translation of the screw and has at least one of the inlet and the outlet which is offset relative to the direction of translation of the screw.

18. The valve according to claim 1, wherein the control device comprises permanent magnets.

19. The valve according to claim 1, wherein the control device comprises coils.

20. The valve according to claim 1, wherein the inductor is stationary relative to the casing.

21. A system for regulating the circulation of a liquid metal comprising a metallic duct and a valve, with the valve comprising a casing forming an enclosure inside which a fluid flows and having at least one inlet and at least one outlet of the fluid, a shutter configured to cooperate with a seat integral with the casing to close at least the at least one inlet or at least the outlet of the fluid, and a device for controlling the position of the shutter relative to the seat, the system comprising:
a control device comprising at least an inductor and at least one armature magnetically coupled and configured to control driving by the inductor of the at least one armature in rotation to selectively cause the shutter to move closer to or to move away from the seat,
wherein the at least one armature is positioned inside the enclosure and is stationary relative to a screw carrying the shutter and having a thread, with the thread of the screw configured to cooperate with a nut integral with the casing, so as to transform a rotation of the at least one armature into a translation of the shutter,
wherein the screw is hollow to define an inner passage for the fluid and the screw has a wall, the wall having an inner face defining the inner passage and an outer face being opposite to the inner face, said outer face being provided with said thread, and the valve is configured for the fluid to primarily flow from the at least one inlet to a first opening in the screw through the inner passage to a second opening of the screw to the at least one outlet, and
wherein the casing and the screw are made of metal, with the valve being welded to the duct.

22. The system of claim 21, wherein the fluid has a temperature greater than or equal to 350° C.

23. The system of claim 21, wherein the liquid metal is liquid sodium used in a circuit of a sodium-cooled nuclear reactor.

24. The valve according to claim 1, wherein the thread provided on the outer face of the screw is so formed as to cooperate with a complementary thread carried by the nut, and wherein the thread provided on the outer face of the screw, along its entire length, faces the inner passage defined by the inner face of the screw.

25. The system of claim 21, wherein the fluid has a temperature greater than or equal to 400° C.

26. A valve comprising:
an armature;
an inductor configured to drive the armature;
a casing comprising an inlet, a seat, a nut, and an outlet;
a shutter configured to cooperate with the seat, to close one of the inlet and the outlet; and
a screw positioned within the casing,
wherein the screw comprises:
a thread configured to cooperate with the nut to move the shutter closer to or away from the seat when the inductor drives the armature, and
a hollow along a length of the screw to define a passage through the screw, and
wherein, when the valve is open, fluid flows from the inlet of the casing, through the passage of screw, to the outlet of the casing.

27. The valve of claim 26, wherein the inductor rotatably drives the armature.

* * * * *